US012309501B2

(12) United States Patent
Price et al.

(10) Patent No.: US 12,309,501 B2
(45) Date of Patent: *May 20, 2025

(54) SPAD ARRAY FOR INTENSITY IMAGE SENSING ON HEAD-MOUNTED DISPLAYS

(71) Applicant: Microsoft Technology Licensing, LLC, Redmond, WA (US)

(72) Inventors: Raymond Kirk Price, Carnation, WA (US); Michael Bleyer, Seattle, WA (US); Christopher Douglas Edmonds, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/627,616

(22) Filed: Apr. 5, 2024

(65) Prior Publication Data
US 2024/0276107 A1 Aug. 15, 2024

Related U.S. Application Data

(63) Continuation of application No. 17/107,310, filed on Nov. 30, 2020, now Pat. No. 11,985,433.

(51) Int. Cl.
| H04N 23/81 | (2023.01) |
| G02B 27/01 | (2006.01) |
| G06T 7/20 | (2017.01) |
| G06T 7/593 | (2017.01) |
| H04N 13/239 | (2018.01) |
| H04N 13/254 | (2018.01) |
| G01S 7/4914 | (2020.01) |

(Continued)

(52) U.S. Cl.
CPC ......... *H04N 23/81* (2023.01); *G02B 27/0172* (2013.01); *G06T 7/20* (2013.01); *G06T 7/593* (2017.01); *H04N 13/239* (2018.05); *H04N 13/254* (2018.05); *G01S 7/4914* (2013.01); *G02B 2027/0138* (2013.01); *G02B 2027/014* (2013.01); *G02B 2027/0178* (2013.01); *H10F 39/18* (2025.01); *H10F 39/191* (2025.01)

(58) Field of Classification Search
None
See application file for complete search history.

(56) References Cited

U.S. PATENT DOCUMENTS 10,312,275 B2 * 6/2019 Hynecek .................. G01S 17/10
10,957,724 B2 * 3/2021 Hynecek ............... G01S 7/4816
11,275,186 B2 * 3/2022 McGarvey ............ G01S 17/894
(Continued)

OTHER PUBLICATIONS

U.S. Appl. No. 17/107,310, filed Nov. 30, 2020.
(Continued)

*Primary Examiner* — Fred Tzeng
(74) *Attorney, Agent, or Firm* — Workman Nydegger

(57) ABSTRACT

An HMD includes a single photon avalanche diode (SPAD) array comprising a plurality of SPAD pixels. The HMD also includes a display positioned to display images for viewing by an eye of a user. The HMD also includes one or more processors and one or more hardware storage devices storing instructions that are executable by the one or more processors to configure the HMD to perform various acts associated with using the SPAD array to capture an image frame of an environment for display to the user.

20 Claims, 8 Drawing Sheets

(51) Int. Cl.
   *H10F 39/12*      (2025.01)
   *H10F 39/18*      (2025.01)

(56) References Cited

U.S. PATENT DOCUMENTS

| | | | |
|---|---|---|---|
| 11,428,826 B2* | 8/2022 | McGarvey | G01T 1/248 |
| 11,785,199 B2* | 10/2023 | Price | H04N 23/20 |
| | | | 348/46 |
| 2019/0103504 A1* | 4/2019 | Yamashita | H01L 27/14636 |
| 2020/0252564 A1* | 8/2020 | Palubiak | H01L 31/02027 |

OTHER PUBLICATIONS

Communication pursuant to Article 94(3) EPC Received for European Application No. 21752385.1, mailed on Apr. 15, 2025, 05 pages.

* cited by examiner

700

SPAD ARRAY FOR INTENSITY IMAGE SENSING ON HEAD-MOUNTED DISPLAYS

CROSS-REFERENCE TO RELATED APPLICATIONS

This application is a continuation of U.S. patent application Ser. No. 17/107,310, filed on Nov. 30, 2020, and entitled "SPAD ARRAY FOR INTENSITY IMAGE SENSING ON HEAD-MOUNTED DISPLAYS", the entirety of which is incorporated herein by reference for all purposes.

BACKGROUND

Mixed-reality (MR) systems, including virtual-reality and augmented-reality systems, have received significant attention because of their ability to create truly unique experiences for their users. For reference, conventional virtual-reality (VR) systems create a completely immersive experience by restricting their users' views to only a virtual environment. This is often achieved, in VR systems, through the use of a head-mounted device (HMD) that completely blocks any view of the real world. As a result, a user is entirely immersed within the virtual environment. In contrast, conventional augmented-reality (AR) systems create an augmented-reality experience by visually presenting virtual objects that are placed in or that interact with the real world.

As used herein, VR and AR systems are described and referenced interchangeably. Unless stated otherwise, the descriptions herein apply equally to all types of mixed-reality systems, which (as detailed above) includes AR systems, VR reality systems, and/or any other similar system capable of displaying virtual objects.

Some MR systems include one or more cameras and utilize images and/or depth information obtained using the camera(s) to provide pass-through views of a user's environment to the user. An MR system may provide pass-through views in various ways. For example, an MR system may present raw images captured by the camera(s) of the MR system to a user. In other instances, an MR system may modify and/or reproject captured image data to correspond to the perspective of a user's eye to generate pass-through views. An MR system may modify and/or reproject captured image data to generate a pass-through view using depth information for the captured environment obtained by the MR system (e.g., using a depth system of the MR system, such as a time of flight camera, a rangefinder, stereoscopic depth cameras, etc.). In some instances, an MR system utilizes one or more predefined depth values to generate pass-through views (e.g., by performing planar reprojection).

In some instances, pass-through views generated by modifying and/or reprojecting captured image data may at least partially correct for differences in perspective brought about by the physical separation between a user's eyes and the camera(s) of the MR system (known as the "parallax problem," "parallax error," or, simply "parallax"). Such pass-through views/images may be referred to as "parallax-corrected pass-through" views/images. By way of illustration, parallax-corrected pass-through images may appear to a user as though they were captured by cameras that are co-located with the user's eyes.

A pass-through view can aid users in avoiding disorientation and/or safety hazards when transitioning into and/or navigating within a mixed-reality environment. Pass-through views may also enhance user views in low visibility environments. For example, mixed-reality systems configured with long wavelength thermal imaging cameras may facilitate visibility in smoke, haze, fog, and/or dust. Likewise, mixed-reality systems configured with low light imaging cameras facilitate visibility in dark environments where the ambient light level is below the level required for human vision.

However, generating a pass-through view is associated with many challenges. For example, as noted above, generating a parallax-corrected pass-through image typically relies on using depth information associated with a captured environment to reproject intensity information associated with a captured environment. However, conventional techniques for obtaining depth information often result in a temporal or spatial offset between the depth information and the intensity information. For example, spatial offset may occur when a camera for obtaining depth information and a camera for obtaining intensity information are not co-located on an HMD. Where depth information and intensity information are captured using the same camera(s), temporal offset may occur in view of the computational expense and time associated with generating depth information (e.g., compared with generating intensity information). Such artifacts may result in motion blur, jitter, and/or other artifacts that is/are visible to users.

To facilitate imaging of an environment for generating a pass-through view, some MR systems include image sensors that utilize complementary metal-oxide-semiconductor (CMOS) and/or charge-coupled device (CCD) technology. For example, such technologies may include image sensing pixel arrays where each pixel is configured to generate electron-hole pairs in response to detected photons. The electrons may become stored in per-pixel capacitors, and the charge stored in the capacitors may be read out to provide image data (e.g., by converting the stored charge to a voltage).

However, such image sensors suffer from a number of shortcomings. For example, the signal to noise ratio for a conventional image sensor may be highly affected by read noise, especially when imaging under low visibility conditions. For instance, under low light imaging conditions (e.g., where ambient light is below about 10 lux, such as within a range of about 1 millilux or below), a CMOS or CCD imaging pixel may detect only a small number of photons, which may cause the read noise to approach or exceed the signal detected by the imaging pixel and decrease the signal-to-noise ratio.

In addition to providing pass-through imaging, the read noise associated with conventional image sensors may also affect other operations performed by HMDs, such as object tracking (e.g., hand tracking), surface reconstruction, semantic labeling, 3D reconstruction of objects, and/or others.

Thus, for at least the foregoing reasons, there is an ongoing need and desire for improved image sensing techniques for MR HMDs, particularly for imaging under low light conditions and/or for generating pass-through images.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments are directed to systems, methods and devices that utilize or include SPAD arrays for performing intensity image sensing operations and/or other related functionality. In some instances, the SPAD arrays are configured within and/or utilized by head-mounted displays (HMDs) that perform the intensity image sensing operations.

Some embodiments include an HMD that includes a single photon avalanche diode (SPAD) array comprising a plurality of SPAD pixels. The HMD also includes a display positioned to display images for viewing by an eye of a user. The HMD also includes one or more processors and one or more hardware storage devices storing instructions that are executable by the one or more processors to configure the HMD to perform various acts associated with using the SPAD array to capture an image frame of an environment for display to the user.

Some embodiments include a system for facilitating intensity image capture. The system comprises a single photon avalanche diode (SPAD) array comprising a plurality of SPAD pixels and a display positioned to display images for viewing by an eye of a user. The system also includes one or more processors and one or more hardware storage devices storing instructions that are executable by the one or more processors to configure the system to facilitate intensity image sensing by configuring the system to perform various acts associated with facilitating intensity image capture. These acts include, but are not limited to, capturing an intensity image of an environment using the SPAD array, obtaining depth information associated with the environment, and reprojecting the image. In some configurations at least a portion of the image of the environment may be reprojected to the perspective of the eye of the user.

In some instances, the reprojection is based on the depth information associated with the environment and the reprojected image is displayed on the display for viewing by the eye of the user.

Some embodiments also include a head-mounted display (HMD) that includes a single photon avalanche diode (SPAD) array comprising a plurality of SPAD pixels, one or more processors, and one or more hardware storage devices storing instructions that are executable by the one or more processors to configure the HMD to use the SPAD array to facilitate one or more computer vision tasks.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
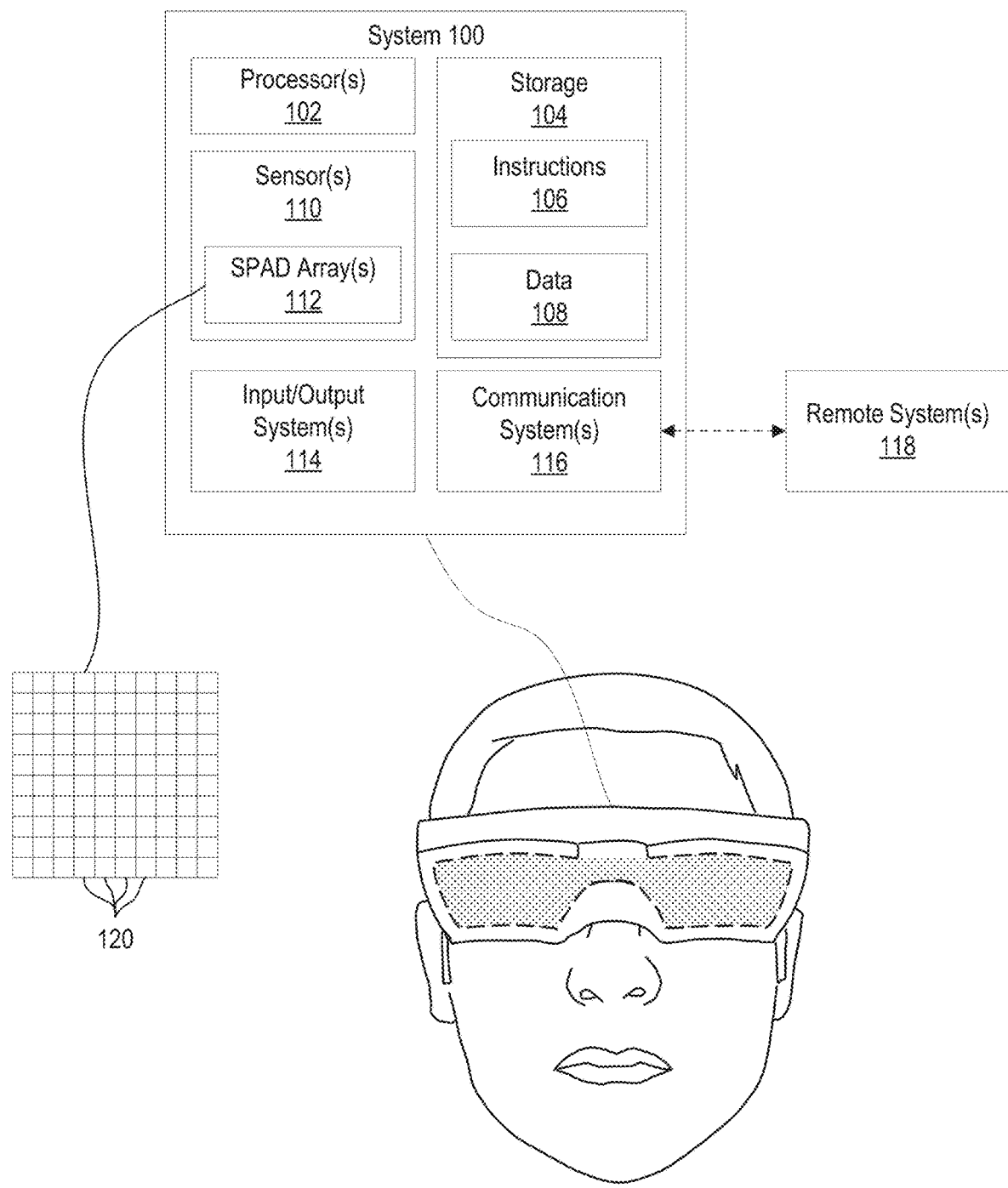
FIG. 1 illustrates example components of an example system that may include or be used to implement one or more disclosed embodiments.

Disclosed embodiments are generally directed to systems, methods and devices that utilize SPAD arrays for performing intensity image sensing operations and other functions on display devices, such as, but not limited to head-mounted displays (HMDs).

Examples of Technical Benefits, Improvements, and Practical Applications

Those skilled in the art will recognize, in view of the present disclosure, that at least some of the disclosed embodiments may be implemented to address various shortcomings associated with at least some conventional display systems that perform intensity image sensing operations. The following section outlines some example improvements and/or practical applications provided by the disclosed embodiments. It will be appreciated, however, that the following are examples only and that the embodiments described herein are in no way limited to the example improvements discussed herein.

In contrast with conventional CMOS or CCD sensors, a SPAD is operated at a bias voltage that enables the SPAD to detect a single photon. Upon detecting a single photon, an electron-hole pair is formed, and the electron is accelerated across a high electric field, causing avalanche multiplication (e.g., generating additional electron-hole pairs). Thus, each detected photon may trigger an avalanche event. A SPAD may operate in a gated manner (each gate corresponding to a separate shutter exposure), where each exposure may be configured to result in a binary output. The binary output may comprise a "1" where an avalanche event was detected during an exposure (e.g., where a photon was detected), or a "0" where no avalanche event was detected.

Separate gates may be regarded as "subframes" or "subgates," and consecutive subframes may be integrated over a frame capture time period (e.g., a 30 Hz time period, or some other framerate). The binary output of the subframes over a frame capture time period may be counted, and an intensity value may be calculated based on the counted binary output.

An array of SPADs may form an image sensor, with each SPAD forming a separate pixel in the SPAD array. To capture an image of an environment, each SPAD pixel may detect avalanche events and provide binary output for separate subframes or subgates in the manner described herein. The per-pixel binary output of multiple subframes over a frame capture time period may be counted, and per-pixel intensity values may be calculated based on the counted per-pixel binary output. The per-pixel intensity values may be used to form an intensity image of an environment.

SPAD image sensors may provide a number of advantages over conventional CMOS and/or CCD sensors. For example, the binarization of the SPAD output may reduce or effectively eliminate read noise, thereby improving signal-to-noise ratio for SPAD image sensor arrays as compared with conventional CMOS and/or CCD sensors, particularly under low light imaging conditions. Thus, SPAD sensors may be usable on HMDs to facilitate image capture as well as other tasks (e.g., depth sensing and/or other functions that depend on depth information), especially under low light imaging conditions where conventional CMOS and/or CCD sensors would experience a low signal-to-noise ratio.

Furthermore, as described herein, SPAD arrays may be configured to perform interleaved active imaging operations (e.g., time-of-flight capture) and passive imaging operations (e.g., intensity image capture) in an advantageous manner. Such functionality may provide significant advantages over conventional CMOS and/or CCD sensors. For example, where a single CMOS and/or CCD sensor is used to capture both intensity image information and depth information using time-of-flight techniques, the sensor may alternate between capturing a full intensity frame and capturing a full depth frame. However, such techniques result in a temporal offset between the intensity frames and the depth frames. Such temporal offsets may cause motion blur in parallax-corrected images and/or other problems for other operations that rely on or benefit from temporally aligned intensity and depth information describing a captured environment.

In contrast to conventional systems, the SPAD arrays utilized within embodiments of the present disclosure are configured to perform interleaved intensity image capture operations and time-of-flight capture operations at the sub-frame level. For example, over a frame capture time period, a SPAD array may alternate between collecting intensity information (e.g., counting subframes or subgates for which a photon was detected) and collecting depth information (e.g., pulsing a laser and tracking differently delayed subframes or subgates for which a photon was detected) with sub-frame timing. Such functionality may provide frames that comprise intensity information and depth information that are temporally aligned (e.g., a composited three-dimensional image and intensity image), thereby reducing or eliminating motion blur in parallax-corrected pass-through images and/or improving other operations that benefit from temporally aligned intensity and depth information.

In contrast with conventional CMOS and/or CCD sensors, techniques for performing interleaved intensity capture and time-of-flight capture operations with sub-frame timing may be implemented using SPAD arrays. For example, attempting to implement such techniques using conventional CMOS and/or CCD sensors may cause a low signal-to-noise ratio (e.g., by increasing the effect of read noise).

Having just described some of the various high-level features and benefits of the disclosed embodiments, attention will now be directed to FIGS. 1 through 8. These Figures illustrate various conceptual representations, architectures, methods, and supporting illustrations related to the disclosed embodiments.

Example Systems and Techniques for Implementing SPAD Arrays on Mixed-Reality Systems Attention is now directed to FIG. 1, which illustrates an example system 100 that may include or be used to implement one or more disclosed embodiments. FIG. 1 depicts the system 100 as a head-mounted display (HMD) configured for placement over a head of a user to display virtual content for viewing by the user's eyes. Such an HMD may comprise an augmented reality (AR) system, a virtual reality (VR) system, and/or any other type of HMD. Although the present disclosure focuses, in at least some respects, on a system 100 implemented as an HMD, it should be noted that at the techniques described herein for utilizing SPAD arrays may be implemented using other types of systems.

FIG. 1 illustrates various example components of the system 100. For example, FIG. 1 illustrates an implementation in which the system includes processor(s) 102, storage 104, sensor(s) 110, I/O system(s) 114, and communication system(s) 116. Although FIG. 1 illustrates a system 100 as including particular components, one will appreciate, in view of the present disclosure, that a system 100 may comprise any number of additional or alternative components.

The processor(s) 102 may comprise one or more sets of electronic circuitry that include any number of logic units, registers, and/or control units to facilitate the execution of computer-readable instructions (e.g., instructions that form a computer program). Such computer-readable instructions may be stored within storage 104. The storage 104 may comprise physical system memory and may be volatile, non-volatile, or some combination thereof. Furthermore, storage 104 may comprise local storage, remote storage (e.g., accessible via communication system(s) 116 or otherwise), or some combination thereof. Additional details related to processors (e.g., processor(s) 102) and computer storage media (e.g., storage 104) will be provided hereinafter.

In some implementations, the processor(s) 102 may comprise or be configurable to execute any combination of software and/or hardware components that are operable to facilitate processing using machine learning models or other artificial intelligence-based structures/architectures. For example, processor(s) 102 may comprise and/or utilize hardware components or computer-executable instructions operable to carry out function blocks and/or processing layers configured in the form of, by way of non-limiting example, single-layer neural networks, feed forward neural networks, radial basis function networks, deep feed-forward networks, recurrent neural networks, long-short term memory (LSTM) networks, gated recurrent units, autoencoder neural networks, variational autoencoders, denoising autoencoders, sparse autoencoders, Markov chains, Hopfield neural networks, Boltzmann machine networks, restricted Boltzmann machine networks, deep belief networks, deep convolutional networks (or convolutional neural networks), deconvolutional neural networks, deep convolutional inverse graphics networks, generative adversarial networks, liquid state machines, extreme learning machines, echo state networks, deep residual networks, Kohonen networks, support vector machines, neural Turing machines, and/or others.

As will be described in more detail, the processor(s) 102 may be configured to execute instructions 106 stored within storage 104 to perform certain actions associated with implementing SPAD arrays. The actions may rely at least in part on data 108 (e.g., avalanche event counting or tracking, etc.) stored on storage 104 in a volatile or non-volatile manner.

In some instances, the actions may rely at least in part on communication system(s) 116 for receiving data from remote system(s) 118, which may include, for example, separate systems or computing devices, sensors, and/or others. The communications system(s) 118 may comprise any combination of software or hardware components that are operable to facilitate communication between on-system components/devices and/or with off-system components/devices. For example, the communications system(s) 118 may comprise ports, buses, or other physical connection apparatuses for communicating with other devices/components. Additionally, or alternatively, the communications system(s) 118 may comprise systems/components operable to communicate wirelessly with external systems and/or devices through any suitable communication channel(s), such as, by way of non-limiting example, Bluetooth, ultra-wideband, WLAN, infrared communication, and/or others.

FIG. 1 illustrates that a system 100 may comprise or be in communication with sensor(s) 110. Sensor(s) 110 may comprise any device for capturing or measuring data representative of perceivable phenomenon. By way of non-limiting example, the sensor(s) 110 may comprise one or more image sensors, microphones, thermometers, barometers, magnetometers, accelerometers, gyroscopes, and/or others.

FIG. 1 also illustrates that the sensor(s) 110 may include SPAD array(s) 112. As depicted in FIG. 1, a SPAD array 112 may comprise an arrangement of SPAD pixels 120 that are each configured to facilitate avalanche events in response to sensing a photon, as described hereinabove. As will be described in more detail hereinafter, SPAD array(s) 112 may be implemented on a system 100 (e.g., an MR HMD) to facilitate various functions such as image capture and/or computer vision tasks.

Furthermore, FIG. 1 illustrates that a system 100 may comprise or be in communication with I/O system(s) 114. I/O system(s) 114 may include any type of input or output device such as, byway of non-limiting example, a touch screen, a mouse, a keyboard, a controller, and/or others, without limitation. For example, the I/O system(s) 114 may include a display system that may comprise any number of display panels, optics, laser scanning display assemblies, and/or other components. In some instances, a SPAD array 112 may be configured with a resolution of SPAD pixels 120 that matches a pixel resolution of a display system, which may facilitate high-fidelity pass-through imaging.

Figure 2:
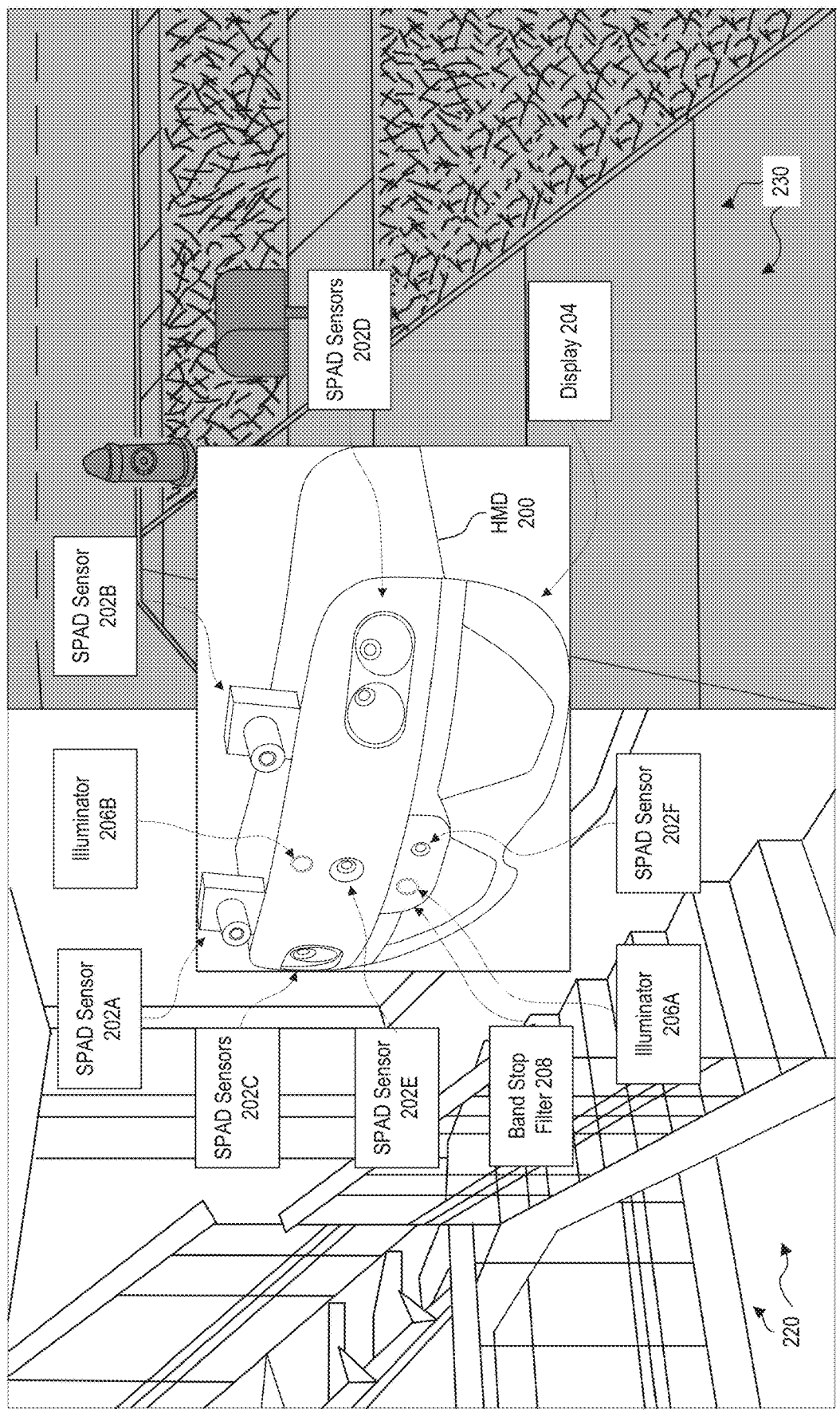
FIG. 2 illustrates example implementations of single photon avalanche diode (SPAD) sensors that may be implemented in head-mounted displays (HMD) configured for facilitating one or more disclosed embodiments in different physical environments.

FIG. 2 illustrates example implementations of single photon avalanche diode (SPAD) sensors that may be implemented in head-mounted displays (HMD) configured for facilitating one or more disclosed embodiments in different physical environments. In particular, FIG. 2 shows an example HMD 200, which may correspond in at least some respects to the system 100 described hereinabove with reference to FIG. 1. As is shown in FIG. 2, an HMD 200 may implement one or more SPAD sensors in various ways and/or for various purposes. A SPAD sensor may comprise a SPAD array 112 as described above.

For example, FIG. 2 shows that the HMD 200 includes a SPAD sensor 202A and a SPAD sensor 202B, which together may comprise a stereo pair of SPAD sensors. The SPAD sensors 202A and 202B may be configured to capture intensity image frames as described hereinabove (e.g., by counting photons or avalanche events detected over a frame capture time period on a per-pixel basis). In some instances, the SPAD sensors 202A and 202B are configured to capture intensity images in a synchronized manner. For instance, the SPAD sensors 202A and 202B may be synchronized in at least one of exposure or readout, such that separate intensity images of a captured environment are substantially temporally synchronized.

In some implementations, the HMD 200 is configured to perform stereoscopic depth computations using a stereo pair of intensity images captured by the SPAD sensors 202A and 202B (e.g., stereo matching). In this regard, an HMD 200 may utilize the SPAD sensors 202A and 202B to obtain intensity information and depth information associated with a captured environment. In some instances, the HMD 200 may utilize the intensity information and the depth information to provide pass-through images for viewing by a user.

For example, FIG. 2 shows that the HMD 200 may comprise a display 204 positioned on the HMD 200 to display images for viewing by one or more eyes of a user operating the HMD 200. The HMD 200 may, in some implementations, generate reprojected images for presentation on the display 204 based on the intensity information and the depth information captured using the SPAD sensors 202A and 202B (or other SPAD sensors of the HMD 200). In some instances, the display 204 may comprise at least a portion of an optically transparent display assembly configured to display images to a user while allowing environmental light (if any) to transmit toward the user's eye(s). In some instances, the display 204 may comprise at least a portion of an optically opaque display assembly that is configured to display images to a user while substantially preventing environmental light (if any) from transmitting toward or reaching the user's eye(s).

FIG. 2 also illustrates that an HMD 200 may comprise any number of additional or alternative SPAD sensors for performing any additional or alternative functions. For example, FIG. 2 illustrates SPAD sensors 202C and SPAD sensors 202D, which may also be configured to capture intensity images to facilitate simultaneous localization and mapping (SLAM). FIG. 2 furthermore illustrates that the HMD 200 may comprise a SPAD sensor 202E configured for still image and/or video capture of an environment.

An HMD 200 may additionally or alternatively comprise a SPAD sensor 202F configured to operate in conjunction with an illuminator 206A to facilitate time of flight capture, as will be described in more detail hereafter. In some implementations, the HMD 200 may comprise a band stop filter 208 to facilitate time of flight capture (e.g., to substantially block light of one or more frequencies outside of a band of frequencies emitted by the illuminator 206A). FIG. 2 also shows an illuminator 206B to illustrate that any of the SPAD sensors of an HMD 200 may be configured to sense light emitted by the illuminator 206B (e.g., to perform interleaved time of flight operations, as described in more detail hereinafter).

One will appreciate, in view of the present disclosure, that an HMD 200 may comprise any additional components not explicitly illustrated by example in FIG. 2. For instance, in some implementations, one or more SPAD sensors of an HMD 200 are configured to operate in conjunction with one or more variable focus lens to allow dynamic adjustment of the focus of an environment relative to the SPAD sensor(s).

The SPAD sensors of an HMD 200 may be configured to capture real-world environments under various lighting conditions. For example, FIG. 2 illustrates a lighted environment 220 and a low light environment 230. A lighted environment 220 may have ambient lighting of about 10 lux or above, whereas a low light environment may have ambient lighting of about 10 lux or below. In some instances, as described hereinabove, a SPAD sensor is operable to facilitate improved imaging capture performance, as compared with conventional CMOS or CCD sensors, particularly under low light conditions.

Figure 3:
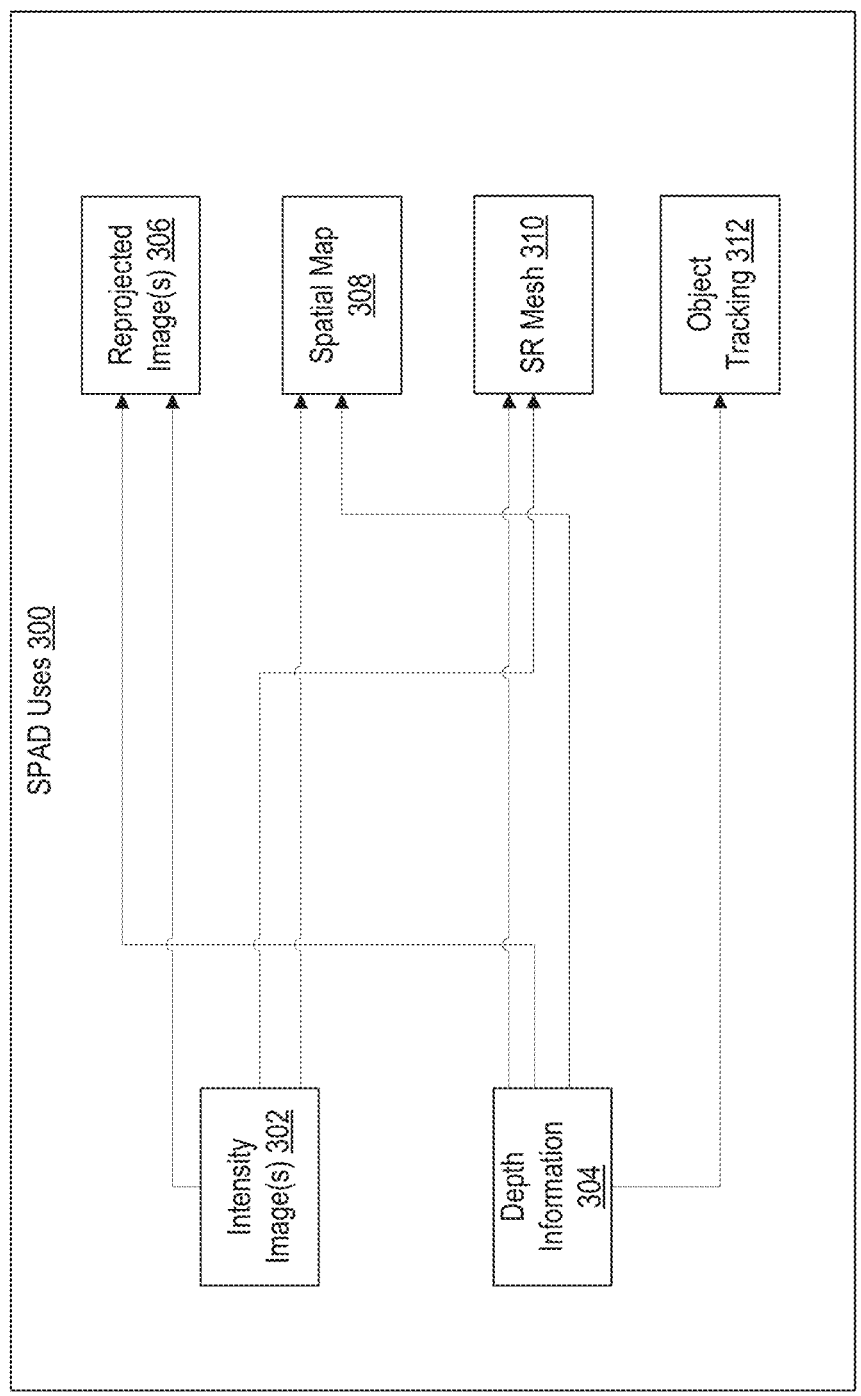
FIG. 3 illustrates example uses of SPAD sensors for mixed-reality systems.

FIG. 3 illustrates example SPAD uses 300 of SPAD sensors for mixed-reality systems. For example, an HMD 200 may utilize the SPAD sensors 202A-202F for one or more of the SPAD uses 300 depicted in FIG. 3.

As indicated hereinabove, one or more of the SPAD sensors 202A-202F of an HMD 200 may be configured to capture intensity images 302 of an environment (e.g., a lighted environment 220 or a low light environment 230), such as by counting photons or avalanche events detected over a frame capture time period on a per-pixel basis.

Also as indicated above, one or more SPAD sensors 202A-202F of an HMD 200 may be used to obtain depth information 304 associated with an environment. In some implementations, the depth information 304 is obtained based on stereo depth computations performed on a stereo pair of images captured by a stereo pair of SPAD sensors (e.g., SPAD sensors 202A and 202B). For example, an HMD 200 may compare pixel patches of images captured by a stereo pair of SPAD sensors to calculate per-pixel disparity values (e.g., by minimizing a cost function), and the disparity values may provide a basis for the depth information 304 (e.g., based on a known baseline distance between SPAD sensors of the stereo pair of SPAD sensors).

In some implementations, the depth information associated with the environment is obtained based on time-of-flight computations performed using light emitted from an illuminator (e.g., illuminator 206A and/or 206B) and detected by a SPAD sensor (e.g., SPAD sensors 202A-202F). For example, an illuminator may emit a first pulse of light, and SPAD pixels of a SPAD sensor may be configured to apply a first shutter (e.g., corresponding to a subframe or subgate) following the emission of the pulse of light by a first predefined delay period. The first predefined delay period may correspond to a first distance (or range of distances) that light emitted by the illuminator may have traveled before being detected by a SPAD pixel. In this regard, SPAD pixels that detect a photon when applying the first shutter may be tracked as capturing a portion of a real-world environment that is distanced from the SPAD pixel according to the first distance.

The illuminator may then emit a second pulse of light, and the SPAD pixels of the SPAD sensor may be configured to apply a second shutter following the emission of the pulse of light by a second predefined delay period, which may correspond to a second distance. Thus, SPAD pixels that detect a photon when applying the second shutter may be tracked as capturing a portion of a real-world environment that is distanced from the SPAD pixel according to the second distance. Additional pulses and shutters may be applied with separate delay periods corresponding to separate distances. A system 100 may track the shutters that correspond to a detected photon on a per-pixel basis (thereby providing per-pixel depth information 304).

The intensity images 302 and/or the depth information 304 may be used for various functionalities associated with providing MR experiences. For instance, as indicated above, the intensity image(s) 302 may comprise per-pixel intensity information, and the depth information 304 may comprise per-pixel depth information. Thus, in some implementations, a system 100 (e.g., HMD 200) generates reprojected image(s) 306 using the intensity image(s) 302 and the depth information 304 (as indicated in FIG. 3 by the arrows extending from the intensity image(s) 302 and the depth information 304 toward the reprojected image(s) 306). For example, a system may identify 3D points by performing per-pixel unprojections based on the depth information 304 into 3D space and then projecting the 3D points onto 2D points of an image plane associated with a perspective of a user's eye. The reprojected image(s) 306 may then be formed using the coordinates of the 2D points and the corresponding intensity information from the intensity image(s) 302.

The reprojected image(s) 306 may then be displayed for viewing by one or more eyes of a user. One will appreciate that separate reprojected images 306 may be generated for presentation to separate eyes of a user, and that reprojected images 306 may be generated continuously to provide a continuous pass-through experience for users. For example, a SPAD-based intensity images 302 and/or depth information 304 may be obtained at a rate of about 30 Hz or greater to provide reprojected image(s) for display to a user at a rate of about 30 Hz or greater.

In addition to generating reprojected image(s) 306, intensity image(s) 302 and/or depth information 304 obtained using SPAD arrays may be used to facilitate one or more computer vision tasks. For example, as indicated above, one or more SPAD sensors (e.g., SPAD sensors 202C and 202D) may be used to facilitate SLAM to generate and/or update a spatial map 308 of an environment (e.g., as indicated in FIG. 3 by the arrows extending from the intensity image(s) 302 and the depth information 304 toward the spatial map 308). For example, a system 100 may be configured to perform feature detection on intensity image(s) 302 to identify anchor points within a captured environment. Information related to the positioning of the system 100 during capture may be stored as a keyframe within a spatial map 308, and information related to the anchor points may also become stored within the spatial map 308. The relative distance between the anchor points and the keyframes may be based on the depth information 304.

Furthermore, a system may be configured to generate a surface reconstruction (SR) mesh 310 based on intensity image(s) 302 and depth information 304 obtained using one or more SPAD sensors (e.g., as indicated in FIG. 3 by the arrows extending from the intensity image(s) 302 and the depth information 304 toward the SR mesh 310). For example, information about the geometry and relative positioning of environmental objects may be captured within the depth information 304, and information about the textures of environmental objects may be captured within the intensity image(s) 302. Thus, the depth information 304 may be used to build a mesh of an environment, and the intensity image(s) 302 may supply the texturing to be applied to the mesh.

A system may additionally or alternatively be configured to perform object tracking (e.g., hand tracking) using depth information 304 obtained using one or more SPAD sensors (e.g., as indicated in FIG. 3 by the arrow extending from the depth information 304 toward the object tracking 312).

Accordingly, in view of the foregoing, it will be appreciated that an HMD 200 or other similar display device is configurable with one or more SPAD arrays to facilitate image capture and/or other computer vision tasks in an advantageous manner, particularly in low light environments (e.g., as compared with conventional image sensors that rely on CCD and/or CMOS technologies).

Figure 4:
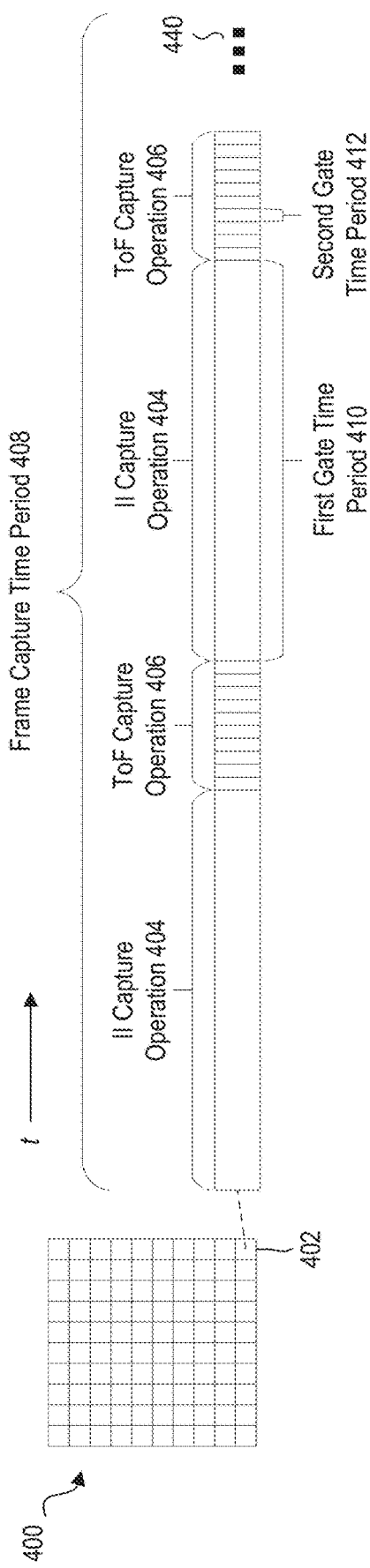
FIG. 4 illustrates an example SPAD array configured for implementing interleaved intensity image capture and time of flight capture operations.

A SPAD array is configured, in some implementations, to perform interleaved intensity image capture and time of flight capture operations to obtain intensity image(s) 302 and depth information 304. FIG. 4 illustrates an example SPAD array 400, which may comprise a part of a SPAD sensor and may correspond to the SPAD array(s) 112 described hereinabove with reference to FIG. 1. Thus, a SPAD pixel 402 of the SPAD array 400 may be configured to trigger avalanche events in response to detecting photons. A SPAD pixel 402 may be operated in a gated manner to facilitate interleaved intensity image (II) capture operations 404 and time-of-flight (ToF) capture operations 406. As is conceptually depicted in FIG. 4, a system may alternate between performing II capture operations 404 and ToF capture operations 406 (e.g., for each SPAD pixel of the SPAD array 400) over a frame capture time period 408 to capture intensity information (from the II capture operations 404) and depth information (from the ToF capture operations 406) that are substantially in temporal alignment. A frame capture time period 408 may comprise any number of interleaved II capture operations 404 and ToF capture operations 406, as indicated by the ellipsis 440. The axis t in FIG. 4 provides temporal context for operations performed over the frame capture time period 408.

FIG. 4 illustrates that an II capture operation 404 may comprise applying a shutter for a first gate time period 410. Applying the shutter may configure the SPAD pixel 402 to trigger an avalanche event in response to detecting a photon. Avalanche events detected during II capture operations 404 may be counted on a per-pixel basis over a frame capture time period 408, even where ToF capture operations 406 intervene between separate II capture operations 404. The counted avalanche events may be used to determine per-pixel intensity values for an intensity image (e.g., intensity image(s) 302).

Although FIG. 4 illustrates an implementation in which each separate II capture operation 404 comprises applying a single shutter for the first gate time period 410 (e.g., which may be regarded as a subgate or subframe exposure, as noted hereinabove), one will appreciate, in view of the present disclosure, that an II capture operation 404 may comprise any number of separate shutter applications prior to alternating to perform a ToF capture operation 406.

FIG. 4 illustrates that a ToF capture operation 406 may comprise applying a plurality of separate shutters for a second gate time period 412 (each separate shutter being represented by individual rectangular blocks within a ToF capture operation 406). Each separately applied shutter may configure the SPAD pixel 402 to trigger an avalanche event in response to detecting a photon, and each separately applied shutter may follow a respective pulse of light by a respective delay period. In this regard, separate shutters of a ToF capture operation 406 may be associated with separate depth values. Additional details concerning shutter application during ToF capture operations 406 will be provided with reference to FIG. 6. Although FIG. 4 illustrates ToF operations 406 as each comprising an application of a plurality of separate shutters, one will appreciate, in view of the present disclosure, that a ToF capture operation 406 may comprise an application of any number of shutters, such as a single shutter.

FIG. 4 illustrates an example in which the second gate time period 412 for shutter applications during ToF capture operations 406 is shorter or less than the first gate time period 410 for shutter applications during II capture operations 404. For example, in some implementations, a longer exposure time for II capture operations 404 may be beneficial under low light imaging conditions to allow a maximal number of photons to be detected by a SPAD pixel 402.

Furthermore, in some implementations, a short exposure time for ToF capture operations 406 provides improved granularity or resolution in depth information acquired based on a ToF capture operation 406. By way of non-limiting example, a first gate time period 410 may comprise a time period on the order of milliseconds, whereas a second gate time period 412 may comprise a time period on the order of nanoseconds or fractions thereof.

Furthermore, although FIG. 4 illustrates all shutters associated with II capture operations 404 being applied for the first gate time period 410 and illustrates all shutters associated with ToF capture operations 406 being applied for the second gate time period 412, one will appreciate that separate shutters of II capture operations 404 may utilize different gate time periods, and likewise separate shutters of ToF capture operations 406 may utilize different gate time periods.

Figure 5:
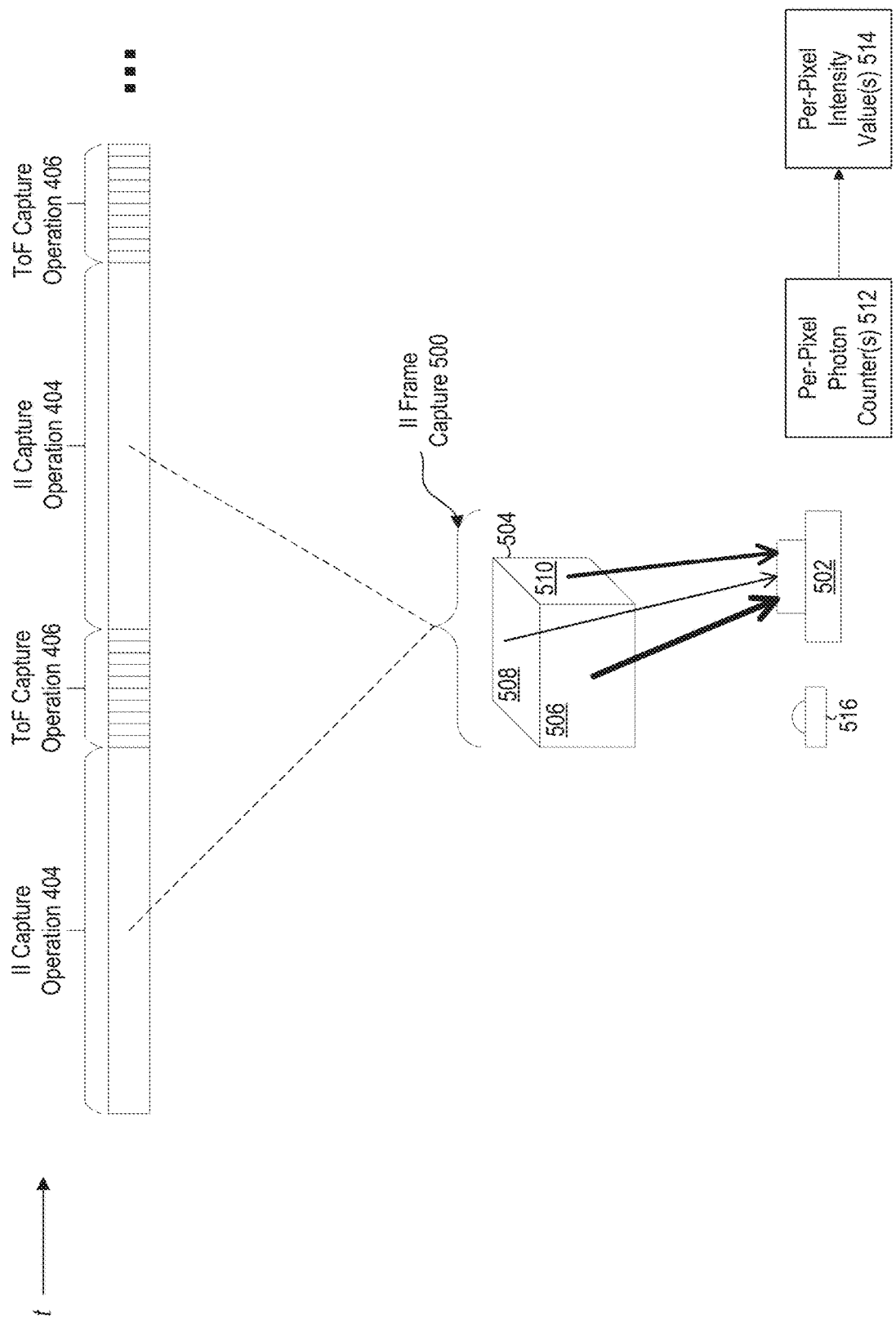
FIG. 5 illustrates a conceptual representation of an intensity image frame capture using interleaved intensity image capture and time of flight capture operations.

By way of illustration, FIG. 5 shows a conceptual representation of an intensity image (II) frame capture 500 using interleaved II capture operations 404 and ToF capture operations 406. FIG. 5 shows a SPAD sensor 502, which may comprise a SPAD array 400 having a plurality of SPAD pixels 402 each configured to perform interleaved II capture operations 404 and ToF capture operations 406.

FIG. 5 depicts an environmental object 504 with a front surface 506, a top surface 508, and a right surface 510. Each surface may reflect photons of ambient light toward the SPAD sensor 502, indicated in FIG. 5 by the arrows extending from the various surfaces of the environmental object 504 toward the SPAD sensor 502. As is evident from FIG. 5, the arrows extending from the environmental object 504 comprise different thicknesses, indicating that the different surfaces of the environmental object 504 may reflect different amounts of light or numbers of photons toward the SPAD sensor 502.

As illustrated, FIG. 5 shows the front surface 506 with the thickest arrow extending therefrom toward the SPAD sensor 502, indicating that the front surface 506 reflects the greatest number of photons toward the SPAD sensor 502 relative to the other two surfaces. FIG. 5 also shows the top surface 508 with a thinnest arrow extending therefrom toward the SPAD sensor 502, indicating that the top surface 508 reflects the lowest number of photons toward the SPAD sensor 502 relative to the other two surfaces. Also, FIG. 5 shows the right surface 510 with an arrow of intermediate thickness extending therefrom toward the SPAD sensor 502, indicating that the right surface reflects an intermediate number of photons toward the SPAD sensor 502 relative to the other two surfaces.

FIG. 5 shows the different arrows extending from the different surfaces of the environmental object 504 toward different portions of the SPAD sensor 502, indicating that different SPAD pixels of a SPAD array of the SPAD sensor 502 may capture photons reflected by different portions of the environment object 504. For instance, a first set of SPAD pixels may detect photons reflected by the front surface 506, a second set of SPAD pixels may detect photons reflected by the right surface 510, and a third set of SPAD pixels may detect photons reflected by the top surface 508 (a set of SPAD pixels may comprise any number of SPAD pixels).

The SPAD pixels of each set of SPAD pixels may iteratively perform II capture operations 404 and ToF capture operations 406 over a frame capture time period 408. During each II capture operation 404 over the frame capture time period 408, a shutter may be applied to configure the different sets of SPAD pixels of the SPAD sensor 502 to trigger avalanche events in response to detecting photons reflected from the various surfaces of the environmental object 504 (indicated in FIG. 5 by the dashed lines extending from the II capture operations 404 toward the environmental object 504 and SPAD sensor 502). For each shutter applied, the SPAD pixels may either detect a photon and trigger an avalanche event, or else fail to detect a photon and trigger an avalanche event. Each avalanche event detected may be counted on a per-pixel basis by per-pixel photon counter(s) 512.

In this regard, continuing with the above example, the first set of SPAD pixels (detecting photons reflected by the front surface 506 of the environmental object 504) may detect a greatest number of avalanche events, the third set of SPAD pixels (detecting photons reflected by the top surface 508 of the environmental object 504) may detect a lowest number of avalanche events, and the second set of SPAD pixels (detecting photons reflected by the right surface 510 of the environmental object) may detect an intermediate number of avalanche events. The respective numbers of avalanche events of the respective sets of SPAD pixels may be counted by the per-pixel photon counter(s) 512, and per-pixel intensity values 514 may be obtained based on the respective per-pixel photon counts (e.g., to provide intensity image(s) 302).

One will appreciate, in view of the present disclosure, that per-pixel photon counter(s) 512 are capable of operating in a variety of ways. For example, in some instances, per-pixel photon counter(s) 512 are utilized to read out a digital indication of which the SPAD pixels of a SPAD sensor detected a photon at each II capture operation 404, such that a plurality of readouts is performed or obtained over a frame capture time period 408. In some instances, per-pixel photon counter(s) 512 count avalanche events for each SPAD pixels of a SPAD sensor that detected a photon over the entire frame capture time period 408 and perform a single readout for the entire frame capture time period 408.

FIG. 5 also illustrates an illuminator 516, which may at least partially correspond to an illuminator 206A or 206B as described hereinabove. FIG. 5 shows no pulse of light emitting from the illuminator 516, indicating that an illuminator 516, where present, may refrain from pulsing light during II capture operations 404.

Figure 6:
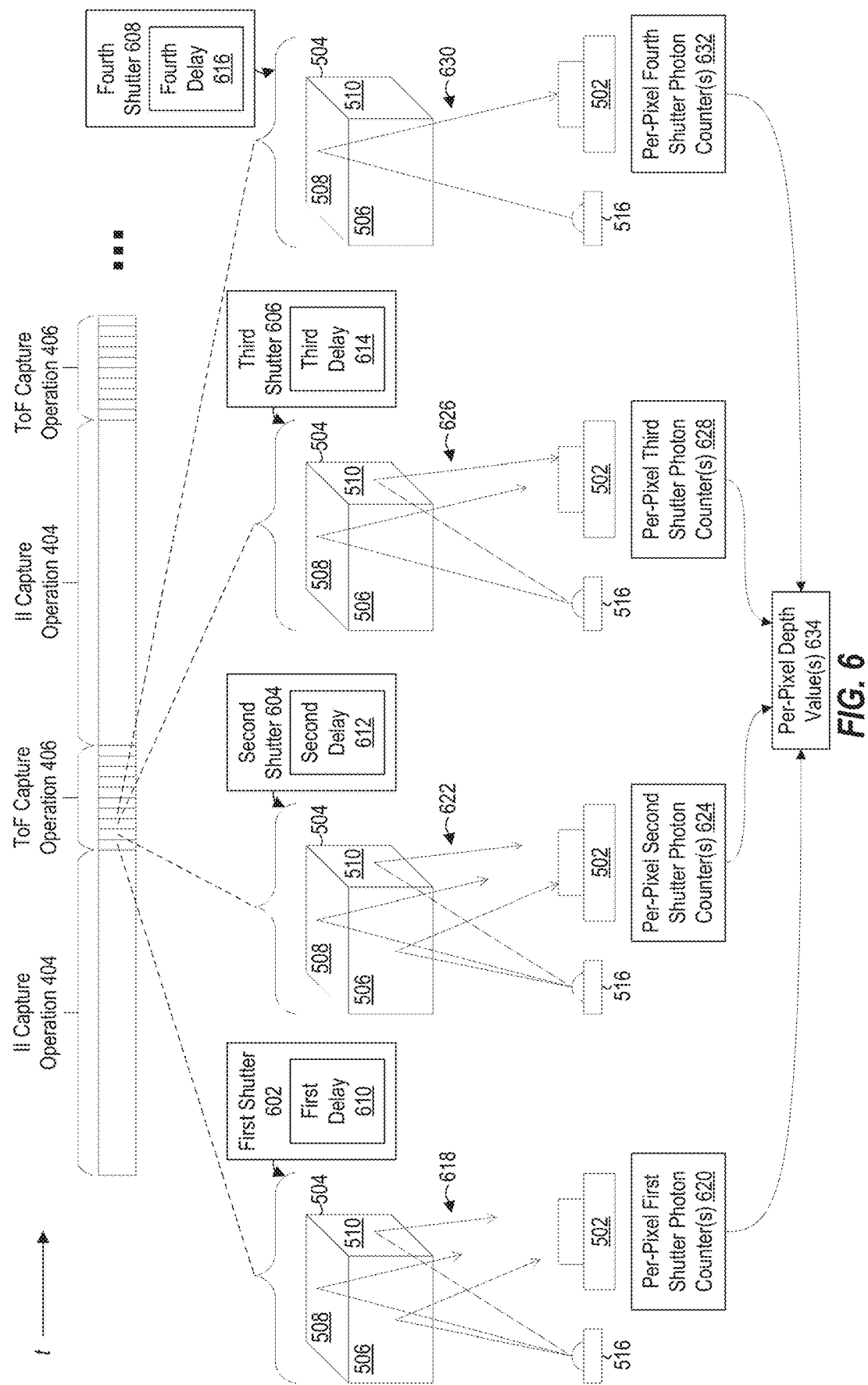
FIG. 6 illustrates a conceptual representation of a time of flight capture operation involving multiple separate shutters associated with different depth values.

FIG. 6 illustrates a conceptual representation of subframes of a ToF capture operation 406 involving multiple separate shutters associated with different depth values. In particular, FIG. 6 shows a conceptual representation of a first shutter 602, a second shutter 604, a third shutter 606, and a fourth shutter 608, each corresponding to separate shutters, subframes, or subgates of a ToF capture operation 406 (as indicated in FIG. 6 by the dashed lines extending from respective subframes of a ToF capture operation 406). As is illustrated in FIG. 6, each separate shutter may be associated with a separate time delay following a corresponding pulse of light from an illuminator. For example, FIG. 6 illustrates the first shutter 602 associated with a first delay 610, the second shutter 604 associated with a second delay 612, the third shutter 606 associated with a third delay 614, and the fourth shutter 608 associated with a fourth delay 616. In some instances, the amount of time associated with each delay may increase in an ordinal manner (e.g., the first delay 610 may be shorter than the second delay 612, which may be shorter than the third delay 614, etc.), however, such a configuration provided as an example only and is non-limiting.

By providing separate shutters associated with separate delay periods following respective pulses of light, a ToF capture operation 406 may allow a SPAD sensor 502 to capture depth information associated with an environmental object 504. For instance, FIG. 6 illustrates that the first shutter 602 may be applied following a first light pulse 618 emitted by the illuminator 516. By way of illustration, the first light pulse 618 is represented in FIG. 6 by separate arrows extending from the illuminator 516 and reflecting off of different surfaces of the environmental object 504 (e.g., the front surface 506, the top surface 508, and the right surface 510). Each different arrow emitting from the illuminator may be representative of a separate photon of the first light pulse 618, with each arrow line depicting the path traveled by the photon and with each arrowhead representing a current position of the photon during application of the first shutter 602.

As noted above, the first shutter 602 may be applied after a first delay 610 following the pulsing of the first light pulse 618 from the illuminator 516. Thus, the photons (e.g., represented by the arrowheads) of the first light pulse 618 may be allowed time to travel from the illuminator 516, reflect off of environmental objects, and travel toward the SPAD sensor 502. FIG. 6 shows each photon of the first light pulse 618 traveling toward the SPAD sensor 502 after reflecting off of the different surfaces of the environmental object 504.

As noted above, the first delay 610 may be indicative of a particular time of flight, which may indicate a distance that a photon detected during application of the first shutter 602 traveled (in total, or after reflecting off of an environmental object). By way of example, the first delay 610 may be associated with a distance of about 6 inches, such that any SPAD pixels of the SPAD sensor 502 that detect an avalanche event during application of the first shutter 602 may be tracked as detecting an environmental object that is positioned at a depth or distance of about 6 inches from the SPAD pixels. Such tracking is facilitated, in some instances, by using per-pixel first shutter photon counter(s) 620, which tracks the SPAD pixels of the SPAD sensor 502 for which an avalanche event was detected during application of the first shutter 602 (indicating an associated depth value for the SPAD pixels that detected an avalanche event during application of the first shutter 602).

As is evident from FIG. 6, during application of the first shutter 602 according to the first delay 610 following the emission of the first light pulse 618 from the illuminator, none of the photons associated with the first light pulse 618 have reached the SPAD sensor 502. In such an example, no avalanche event will have been detected for any of the SPAD pixels of the SPAD sensor 502 during application of the first shutter 602, indicating that no objects or surfaces in an environment captured by the SPAD sensor 502 are positioned at a depth or distance of about 6 inches from the SPAD pixels. Thus, the per-pixel first shutter photon counter(s) 620 will indicate, on a per-pixel basis, that no SPAD pixels of the SPAD sensor capture an environmental object or surface that corresponds to a depth of about 6 inches from the SPAD pixels (or that corresponds to the time of flight associated with the first delay 610).

FIG. 6 shows that, after applying the first shutter 602 according to the first delay 610 following the first light pulse 618, a system may be configured to apply the second shutter 604 according to a second delay 612 following a second light pulse 622 from the illuminator 516. As noted above, the second delay 612 associated with the second shutter 604 may be longer than the first delay 610 associated with the first shutter 602, giving photons emitted according to the second light pulse 622 relatively more time to travel toward the SPAD sensor 502. For example, the second delay 612 may be associated with a distance of about 9 inches, compared to 6 inches as described above by example for the first delay 610. Accordingly, FIG. 6 depicts photons of the second light pulse 622 (represented by arrowheads) as being closer to the SPAD sensor 502 during application of the second shutter 604 according to the second delay 612.

In particular, FIG. 6 shows a photon that reflected off of the front surface 506 of the environmental object 504 as reaching the SPAD sensor 502. This photon may trigger an avalanche event for a first set of SPAD pixels positioned to capture light reflected from the front surface 506 of the environmental object 504 (which may be substantially the same first set of SPAD pixels that detects photons reflected from the front surface 506 of the environmental object 504 during II capture operations 404, as described hereinabove with reference to FIG. 5).

Continuing with the above example, the first set of SPAD pixels of the SPAD sensor 502 that detects an avalanche event during application of the second shutter 604 according to the second delay 612 may be tracked as detecting an environmental object (e.g., a portion of the front surface 506) that is positioned at a depth of about 9 inches from the first set of SPAD pixels. Such tracking is facilitated, in some instances, by using per-pixel second shutter photon counter(s) 624, which tracks the first set of SPAD pixels of the SPAD sensor 502 as having detected an avalanche event during application of the second shutter 604.

FIG. 6 also shows that, after applying the second shutter 604 according to the second delay 612 following the second light pulse 622, a system may be configured to apply the third shutter 606 according to a third delay 614 following a third light pulse 626 from the illuminator 516. As noted above, the third delay 614 associated with the third shutter 606 may be longer than the second delay 612 associated with the second shutter 604, giving photons emitted according to the third light pulse 626 relatively more time to travel toward the SPAD sensor 502. For example, the third delay 614 may be associated with a distance of about 12 inches, compared to 9 inches as described above by example for the second delay 612.

With regard to the foregoing, FIG. 6 depicts some photons of the third light pulse 626 (represented by arrowheads) as being closer to the SPAD sensor 502 during application of the third shutter 606 according to the third delay 614. The depiction of the third shutter 606 in FIG. 6 omits the photon reflected from the front surface 506 of the environmental object 504 for clarity (e.g., the photon may have already reached and reflected from the SPAD sensor 502).

FIG. 6 shows a photon that reflected off of the right surface 510 of the environmental object 504 as reaching the SPAD sensor 502. This photon may trigger an avalanche event for a second set of SPAD pixels positioned to capture light reflected from the right surface 510 of the environmental object 504 (which may be substantially the same second set of SPAD pixels that detects photons reflected from the right surface 510 of the environmental object 504 during II capture operations 404, as described hereinabove with reference to FIG. 5). The second set of SPAD pixels of the SPAD sensor 502 that detects an avalanche event during application of the third shutter 606 according to the third delay 614 may be tracked as detecting an environmental object (e.g., a portion of the right surface 510) that is positioned at a depth of about 12 inches from the second set of SPAD pixels (according to the example distance associated with the third delay 614). Such tracking may be facilitated using per-pixel third shutter photon counter(s) 628, which may track the second set of SPAD pixels of the SPAD sensor 502 as having detected an avalanche event during application of the third shutter 606.

Similarly, FIG. 6 also shows that, after applying the third shutter 606 according to the third delay 614 following the third light pulse 626, a system may be configured to apply the fourth shutter 608 according to a fourth delay 616 following a fourth light pulse 630 from the illuminator 516. As noted above, the fourth delay 616 associated with the fourth shutter 608 may be longer than the third delay 614 associated with the third shutter 606, giving photons emitted according to the fourth light pulse 630 relatively more time to travel toward the SPAD sensor 502. For example, the fourth delay 616 may be associated with a distance of about 15 inches, compared to 12 inches as described above by example for the third delay 614. Accordingly, FIG. 6 depicts a photon of the fourth light pulse 630 (represented by an arrowhead) as being closer to the SPAD sensor 502 during application of the fourth shutter 608 according to the fourth delay 616. The depiction of the fourth shutter 608 in FIG. 6 omits the photons reflected from the front surface 506 and the right surface 510 of the environmental object 504 for clarity (e.g., such photons may have already reached and reflected from the SPAD sensor 502).

FIG. 6 depicts a photon that reflected off of the top surface 508 of the environmental object 504 as reaching the SPAD sensor 502. This photon may trigger an avalanche event for a third set of SPAD pixels positioned to capture light reflected from the top surface 508 of the environmental object 504 (which may be substantially the same third set of SPAD pixels that detects photons reflected from the top surface 508 of the environmental object 504 during II capture operations 404, as described hereinabove with reference to FIG. 5).

The third set of SPAD pixels of the SPAD sensor 502 that detects an avalanche event during application of the fourth shutter 608 according to the fourth delay 616 may be tracked as detecting an environmental object (e.g., a portion of the top surface 508) that is positioned at a depth of about 15 inches from the third set of SPAD pixels (according to the example distance associated with the fourth delay 616). Such tracking is facilitated, in some instances, by using per-pixel fourth shutter photon counter(s) 632, which tracks the third set of SPAD pixels of the SPAD sensor 502 as having detected an avalanche event during application of the third shutter 606.

Although FIG. 6 illustrates performing each shutter associated with its respective delay a single time before proceeding to apply a subsequent shutter associated with a separate delay, one will appreciate, in view of the present disclosure, that a system may repeat applying any shutter according to its corresponding delay following a respective light pulse any number of times before (or after) proceeding to a different shutter and delay in order to achieve a desired signal strength. In some embodiments, a corresponding per-pixel shutter photon counter tracks the SPAD pixels that detect a photon for each application of the corresponding shutter, wherein such tracking is based on a combination of results from each application of the corresponding shutter.

One will appreciate, in view of the present disclosure, that the shutters applied during different ToF capture operations 406 may at least partially differ from one another. For instance, a first ToF capture operation 406 may comprise applying a first shutter associated with a first delay one or more times over the entire first ToF capture operation 406, whereas a second ToF capture operation 406 may comprise applying a second shutter associated with a second delay one or more times over the entire second ToF capture operation 406. Different combinations of shutters may be applied during different ToF capture operations 406.

Based on the counts obtained by each per-pixel shutter photon counter, a system may obtain per-pixel depth values 634. For example, a system may determine which, if any, SPAD pixels of the SPAD sensor detected a photon during the first shutter 602 according to the per-pixel first shutter photon counter(s) 620. In the example provided in FIG. 6, no SPAD pixels detected a photon during the first shutter 602, causing no SPAD pixels of the SPAD sensor 502 to be associated with a depth value associated with the first delay 610.

Additionally, in some embodiments, a system will determine from the per-pixel second shutter photon counter(s) 624 that the first set of SPAD pixels detected photons during the second shutter 604 (e.g., reflected from the front surface 506 of the environmental object 504), thereby causing the system to associate a depth value to the first set of SPAD pixels that corresponds to the second delay 612 (e.g., a depth of 9 inches). Similarly, a system may determine from the per-pixel third shutter photon counter(s) 628 that the second set of SPAD pixels detected photons during the third shutter 606 (e.g., reflected from the right surface 510 of the environmental object 504), causing the system to associate a depth value to the second set of SPAD pixels that corresponds to the third delay 614. Additionally, a system may determine from the per-pixel fourth shutter photon counter(s) 632 that the third set of SPAD pixels detected photons during the fourth shutter 608 (e.g., reflected from the top surface 508 of the environmental object 504), causing the system to associate a depth value to the third set of SPAD pixels that corresponds to the fourth delay 616.

In some instances, one or more SPAD pixels will be counted as detecting photons during different shutters associated with different delay periods following a light pulse, indicating different depth values for the same SPAD pixel(s). Furthermore, in some instances, one or more SPAD pixels will be counted during an application of a shutter as detecting a photon while being counted as not detecting a photon during a separate application of the same shutter.

In view of the foregoing, it will be appreciated that in some implementations, the per-pixel depth value(s) 634 will be determined based on a combination of results obtained during separate applications of the same or different shutters (e.g., shutters associated with the same or different delays). For instance, after one or more ToF capture operations 406 comprising a plurality of shutters, a system may determine a distribution of depth values counted for each SPAD pixel (e.g., the depth values corresponding to different shutter delays for which a photon was detected). The system may then select a depth value to each SPAD pixel based on its respective distribution of detected depth values (e.g., the depth value that was counted the most times may be assigned as the depth value for the SPAD pixel).

Similar to the II capture operation(s) 404, readouts may be performed for each subframe or shutter of a ToF capture operation 406 or in any suitable manner, such as one readout for each ToF capture operation 406, one readout for each entire frame capture time period 408, and/or any other appropriate interval.

In some instances, applying a shutter for a ToF capture operation 406 may comprise, in addition to pulsing light with an illuminator 516, selectively activating a band stop filter configured to substantially block light outside of one or more frequency bands emitted by the illuminator 516 (e.g., when imaging under lighted conditions).

The per-pixel depth value(s) 634 obtained over one or more ToF capture operations 406 of a frame capture time period 408 may be used to provide depth information (e.g., depth information 304) about a captured environment relative to a SPAD sensor system. In some implementations, determined/provided depth information will, advantageously, be at least partially temporally aligned with per-pixel intensity values 514 obtained over one or more interleaved II capture operations 404 of the frame capture time period 408.

The foregoing descriptions have been provided in reference to the use of SPAD arrays within an HMD. However, it will be appreciated that the disclosed functionality and the scope of the disclosed embodiments also extends, in some alternative embodiments, to similar use of SPAD arrays with display devices that are not considered HMD devices.

Example Method(s) for Facilitating Intensity Image Sensing Using One or More SPAD Arrays The following discussion now refers to a number of methods and method acts that may be performed by the disclosed systems. Although the method acts are discussed in a certain order and illustrated in a flow chart as occurring in a particular order, no particular ordering is required unless specifically stated, or required because an act is dependent on another act being completed prior to the act being performed. One will appreciate that certain embodiments of the present disclosure may omit one or more of the acts described herein.

Figure 7:
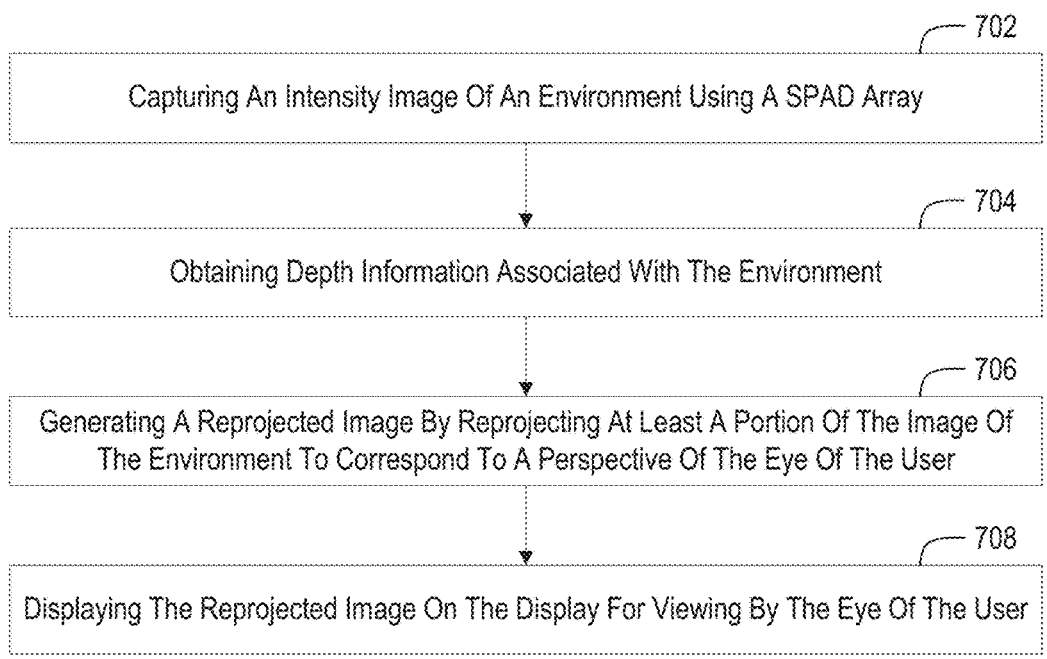
FIG. 7 illustrates an example flow diagram depicting acts associated with facilitating intensity image sensing using one or more SPAD arrays.

FIG. 7 illustrates an example flow diagram 700 depicting acts associated with facilitating intensity image sensing using one or more SPAD arrays. The discussion of the various acts represented in the flow diagrams include references to various hardware components described in more detail with reference to FIG. 1.

Act 702 of flow diagram 700 includes capturing an intensity image of an environment using a SPAD array. Act 702 is performed, in some instances, by a system 100 utilizing processor(s) 102, storage 104, sensor(s) 110, input/output system(s) 114, communication system(s) 116, and/or other components. In some implementations, capturing an intensity image of an environment using a SPAD array comprises counting avalanche events triggered by the SPAD array over a frame capture time period in response to detecting photons on a per-pixel basis. Intensity information for the intensity image may be determined based on the counted per-pixel avalanche events.

Act 704 of flow diagram 700 includes obtaining depth information associated with the environment. Act 704 is performed, in some instances, by a system 100 utilizing processor(s) 102, storage 104, sensor(s) 110, input/output system(s) 114, communication system(s) 116, and/or other components. In some implementations, the depth information associated with the environment is based on time of flight computations performed using light emitted from an illuminator and detected by the SPAD array. In some implementations, the depth information associated with the environment is based on stereo depth computations performed using images captured by a stereo pair of SPAD arrays including the SPAD array and a second SPAD array. The stereo pair of SPAD arrays may be synchronized in at least one of exposure or readout.

Act 706 of flow diagram 700 includes generating a reprojected image by reprojecting at least a portion of the image of the environment to correspond to a perspective of the eye of the user. Act 706 is performed, in some instances, by a system 100 utilizing processor(s) 102, storage 104, communication system(s) 116, and/or other components.

The reprojection may be based on the depth information associated with the environment (e.g., whether obtained via time of flight or stereo matching). For example, generating the reprojected image may include performing per-pixel unprojections based on the depth information into 3D space and then projecting the 3D points onto 2D points of an image plane associated with a perspective of a user's eye. The reprojected image(s) may then be formed using the coordinates of the 2D points and the corresponding intensity information from the intensity image(s) described above with reference to act 702.

Act 708 of flow diagram 700 includes displaying the reprojected image on the display for viewing by the eye of the user. Act 708 is performed, in some instances, by a system 100 utilizing processor(s) 102, storage 104, input/output system(s) 114, communication system(s) 116, and/or other components. The display may comprise an AR and/or a VR display assembly of an HMD (e.g., HMD 200). In some implementations, a pixel resolution of the SPAD array matches a pixel resolution of the display.

Figure 8:
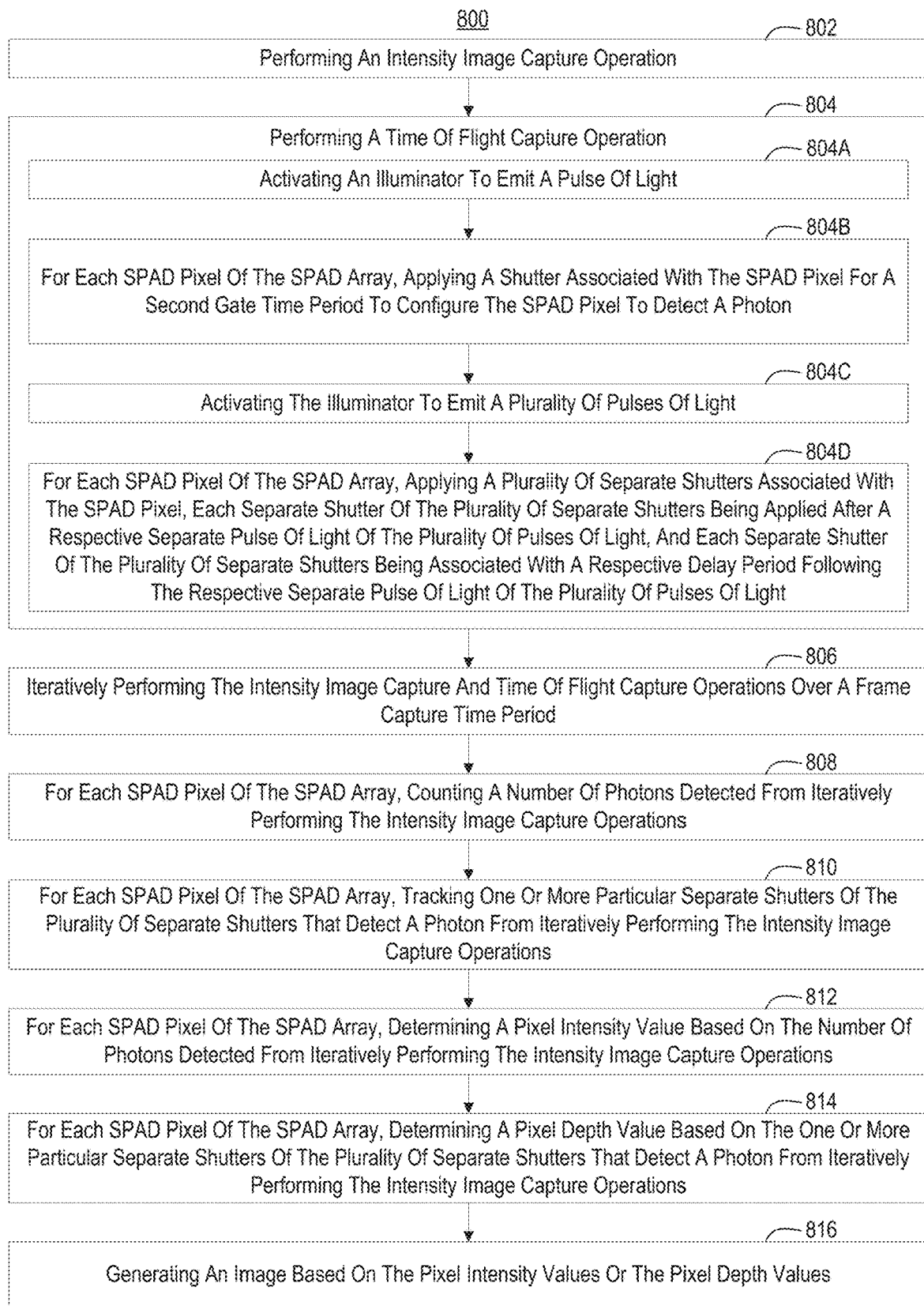
FIG. 8 illustrates an example flow diagram depicting acts associated with performing interleaved intensity image capture and time of flight capture operations using one or more SPAD arrays.

Example Method(s) for Facilitating Intensity Image Capture and Time of Flight Capture FIG. 8 illustrates an example flow diagram depicting acts associated with performing interleaved intensity image capture and time of flight capture operations using one or more SPAD arrays.

Act 802 of flow diagram 800 includes performing an intensity image capture operation. Act 802 is performed, in some instances, by a system 100 utilizing processor(s) 102, storage 104, sensor(s) 110, input/output system(s) 114, communication system(s) 116, and/or other components. Performing the intensity image operation may include, for each SPAD pixel of a SPAD array, applying a shutter associated with the SPAD pixel for a first gate time period to configure the SPAD pixel to detect a photon.

Act 804 of flow diagram 800 includes performing a time of flight capture operation. Act 804 is performed, in some instances, by a system 100 utilizing processor(s) 102, storage 104, sensor(s) 110, input/output system(s) 114, communication system(s) 116, and/or other components. Flow diagram 800 shows that performing act 804 may involve various sub-component or related acts. For example, act 804A of act 804 of flow diagram 800 includes, activating an illuminator to emit a pulse of light. In some implementations, the pulse of light comprises a band of infrared frequencies. Furthermore, in some implementations, performing the time of flight capture operation includes activating a band stop filter configured with a stop band frequency that includes one or more frequencies outside of the band of infrared frequencies of the pulse of light.

Act 804B of act 804 of flow diagram 800 includes, for each SPAD pixel of the SPAD array, applying a shutter associated with the SPAD pixel for a second gate time period to configure the SPAD pixel to detect a photon. In some implementations, the second gate time period is less than the first gate time period.

Act 804C of act 804 of flow diagram 800 includes activating the illuminator to emit a plurality of pulses of light, and act 804D of act 804 of flow diagram 800 includes, for each SPAD pixel of the SPAD array, applying a plurality of separate shutters associated with the SPAD pixel, each separate shutter of the plurality of separate shutters being applied after a respective separate pulse of light of the plurality of pulses of light, and each separate shutter of the plurality of separate shutters being associated with a respective delay period following the respective separate pulse of light of the plurality of pulses of light. In some implementations, each of the plurality of separate shutters is applied for the second gate time period.

Act 806 of flow diagram 800 includes iteratively performing the intensity image capture and time of flight capture operations over a frame capture time period. Act 806 is performed, in some instances, by a system 100 utilizing processor(s) 102, storage 104, sensor(s) 110, input/output system(s) 114, communication system(s) 116, and/or other components. An intensity capture operation may comprise applying any number of shutters before alternating to performing a time of flight capture operation. Similarly, a time of flight capture operation may comprise applying any number of shutters before alternating to performing an intensity capture operation.

Act 808 of flow diagram 800 includes, for each SPAD pixel of the SPAD array, counting a number of photons detected from iteratively performing the intensity image capture operations. Act 808 is performed, in some instances, by a system 100 utilizing processor(s) 102, storage 104, sensor(s) 110, input/output system(s) 114, communication system(s) 116, and/or other components. The per-pixel number of photons (or avalanche events) detected by each SPAD pixel may provide a basis for determining a respective intensity value for each SPAD pixel.

Act 810 of flow diagram 800 includes, for each SPAD pixel of the SPAD array, tracking one or more particular separate shutters of the plurality of separate shutters that detect a photon from iteratively performing the intensity image capture operations. Act 810 is performed, in some instances, by a system 100 utilizing processor(s) 102, storage 104, sensor(s) 110, input/output system(s) 114, communication system(s) 116, and/or other components. For each SPAD pixel, the separate shutter(s) tracked to have detected a photon may provide a basis for determining depth sensed by the SPAD pixel (e.g., based on the delay following the pulse of light associated with the shutter(s)).

Act 812 of flow diagram 800 includes, for each SPAD pixel of the SPAD array, determining a pixel intensity value based on the number of photons detected from iteratively performing the intensity image capture operations. Act 814 of flow diagram 800 includes, for each SPAD pixel of the SPAD array, determining a pixel depth value based on the one or more particular separate shutters of the plurality of separate shutters that detect a photon from iteratively performing the intensity image capture operations. Acts 812 and/or 814 may be performed, in some instances, by a system 100 utilizing processor(s) 102, storage 104, sensor(s) 110, input/output system(s) 114, communication system(s) 116, and/or other components.

Act 816 of flow diagram 800 includes generating an image based on the pixel intensity values or the pixel depth values. Act 816 is performed, in some instances, by a system 100 utilizing processor(s) 102, storage 104, sensor(s) 110, input/output system(s) 114, communication system(s) 116, and/or other components. In some implementations, the per-pixel intensity values and the per-pixel depth values may, advantageously, be at least partially temporally synchronized. The image may comprise a composited three-dimensional image and intensity image.

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are one or more "physical computer storage media" or "hardware storage device(s)." Computer-readable media that merely carry computer-executable instructions without storing the computer-executable instructions are "transmission media." Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SDS") that are based on RAM, Flash memory, phase-change memory ("PCM"), or other types of memory, or other optical disk storage, magnetic disk storage or other magnetic storage devices, or any other medium that can be used to store desired program code means in hardware in the form of computer-executable instructions, data, or data structures and that can be accessed by a general-purpose or special-purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Disclosed embodiments may comprise or utilize cloud computing. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, wearable devices, and the like. The invention may also be practiced in distributed system environments where multiple computer systems (e.g., local and remote systems), which are linked through a network (either by hardwired data links, wireless data links, or by a combination of hardwired and wireless data links), perform tasks. In a distributed system environment, program modules may be located in local and/or remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), central processing units (CPUs), graphics processing units (GPUs), and/or others.

As used herein, the terms "executable module," "executable component," "component," "module," or "engine" can refer to hardware processing units or to software objects, routines, or methods that may be executed on one or more computer systems. The different components, modules, engines, and services described herein may be implemented as objects or processors that execute on one or more computer systems (e.g. as separate threads).

One will also appreciate how any feature or operation disclosed herein may be combined with any one or combination of the other features and operations disclosed herein. Additionally, the content or feature in any one of the figures may be combined or used in connection with any content or feature used in any of the other figures. In this regard, the content disclosed in any one figure is not mutually exclusive and instead may be combinable with the content from any of the other figures.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A method for facilitating image capture of low light environments in a manner that avoids read noise associated with processing images in low light environments, the method comprising:
   repeatedly configuring each single photon avalanche diode (SPAD) pixel of a plurality of SPAD pixels of a SPAD array and each SPAD pixel of a second plurality of SPAD pixels of a second SPAD array to trigger an avalanche event in response to detecting a photon over a frame capture time period;

counting a number of avalanche events for each SPAD pixel of the SPAD array and for each SPAD pixel of the second SPAD array;

generating an image frame of an environment based on the number of avalanche events for each SPAD pixel of the SPAD array;

generating a second image frame of the environment based on the number of avalanche events for each SPAD pixel of the second SPAD array;

generating a reprojected image of the environment by reprojecting at least a portion of the image frame to correspond to a perspective of an eye of a user;

generating a reprojected second image of the environment by reprojecting at least a portion of the second image frame to correspond to a perspective of a second eye of the user; and displaying the reprojected image of the environment and the reprojected second image of the environment on a display positioned to display images for viewing by the eye of the user and the second eye of the user.

2. The method of claim 1, wherein the display is part of an optically transparent display assembly configured to transmit light from the environment toward the eye and the second eye of the user.

3. The method of claim 1, wherein the display is part of an optically opaque display assembly configured to substantially prevent light from the environment from reaching the eye and the second eye of the user.

4. The method of claim 1, further comprising using the SPAD array to consecutively capture image frames of the environment for display to the user at a rate of about 30 Hz or greater.

5. The method of claim 1, wherein a pixel resolution of the SPAD array matches a pixel resolution of the display.

6. A method for facilitating intensity image capture of low light environments in a manner that avoids read noise associated with processing images in low light environments, the method comprising:

capturing an intensity image of an environment using a single photon avalanche diode (SPAD) array comprising a plurality of SPAD pixels;

obtaining depth information associated with the environment;

generating a reprojected image by reprojecting at least a portion of the intensity image of the environment to correspond to a perspective of an eye of a user, the reprojection being based on the depth information associated with the environment; and displaying the reprojected image on a display positioned to display images for viewing by the eye of the user.

7. The method of claim 6, wherein a pixel resolution of the SPAD array matches a pixel resolution of the display.

8. The method of claim 6, wherein a focus of the environment relative to the SPAD array is selectively adjustable via a variable focus lens.

9. The method of claim 6, wherein the depth information associated with the environment is based on time of flight computations performed using light emitted from an illuminator and detected by the SPAD array.

10. The method of claim 6, further comprising capturing a second intensity image of the environment using a second SPAD array comprising a second plurality of SPAD pixels.

11. The method of claim 10, wherein the SPAD array and the second SPAD array are synchronized in at least one of exposure or readout.

12. The method of claim 10, wherein the depth information associated with the environment is based on stereo depth computations performed using the intensity image captured by the SPAD array and the second intensity image captured by second SPAD array.

13. The method of claim 6, wherein the SPAD array and the display are part of a head-mounted display (HMD).

14. A method for facilitating computer vision tasks in low light environments in a manner that avoids read noise associated with processing images in low light environments, the method comprising:

repeatedly configuring each single photon avalanche diode (SPAD) pixel of a first plurality of SPAD pixels of a first SPAD array of a first image sensor and each SPAD pixel of a second plurality of SPAD pixels of a second SPAD array of a second image sensor to trigger an avalanche event in response to detecting a photon over a frame capture time period;

counting or tracking avalanche events for each SPAD pixel of the first SPAD array of the first image sensor and for each SPAD pixel of the second SPAD array of the second image sensor; and facilitating one or more computer vision tasks based on the counting or tracking of the avalanche events for each SPAD pixel of the first SPAD array of the first image sensor and for each SPAD pixel of the second SPAD array of the second image sensor, wherein the one or more computer vision tasks comprise capturing depth information associated with an environment by performing stereo depth computations using images captured by the first SPAD array of the first image sensor and the second SPAD array of the second image sensor.

15. The method of claim 14, wherein the one or more computer vision tasks further comprise simultaneous localization and mapping (SLAM).

16. The method of claim 15, wherein the first image sensor and the second image sensor are part of a head-mounted display (HMD).

17. The method of claim 14, wherein the one or more computer vision tasks further comprise surface reconstruction.

18. The method of claim 17, wherein the first image sensor and the second image sensor are part of a head-mounted display (HMD).

19. The method of claim 14, wherein the one or more computer vision tasks further comprise object tracking.

20. The method of claim 19, wherein the first image sensor and the second image sensor are part of a head-mounted display (HMD).

* * * * *